United States Patent [19]

Dube et al.

[11] Patent Number: 4,750,890
[45] Date of Patent: Jun. 14, 1988

[54] TEST SOCKET FOR AN INTEGRATED CIRCUIT PACKAGE

[75] Inventors: Milford J. Dube, Windsor Locks; Peter E. Kuhn, Bloomfield; Harry P. Yorgensen, Manchester, all of Conn.

[73] Assignee: The J. M. Ney Company, Bloomfield, Conn.

[21] Appl. No.: 63,652

[22] Filed: Jun. 18, 1987

[51] Int. Cl.$^4$ .................................. H01R 13/635
[52] U.S. Cl. .................................. 439/152; 439/70; 439/330; 439/525
[58] Field of Search .............. 439/65, 68-73, 439/152, 159, 259, 261-266, 268-270, 330, 331, 525, 526

[56] References Cited

U.S. PATENT DOCUMENTS

| | | | |
|---|---|---|---|
| 2,456,548 | 12/1948 | Weiner et al. | 173/361 |
| 2,524,701 | 10/1950 | Grill | 173/330 |
| 2,919,317 | 12/1959 | Mercer et al. | 200/51.12 |
| 3,214,726 | 10/1965 | Cardenas et al. | 339/189 |
| 3,275,970 | 9/1966 | Johanson et al. | 339/143 |
| 3,323,814 | 6/1967 | Phillips | 287/20 |
| 3,491,326 | 1/1970 | Pfister et al. | 339/19 |
| 3,724,322 | 4/1973 | Reed | 339/45 R |
| 3,737,835 | 6/1973 | Clement et al. | 339/45 R |
| 4,012,097 | 3/1977 | Long et al. | 339/45 M |
| 4,038,505 | 7/1977 | Gasparaitis et al. | 339/176 M |
| 4,114,969 | 9/1978 | Borg | 339/45 R |
| 4,157,855 | 6/1979 | Chan | 339/45 R |
| 4,188,085 | 2/1980 | Aldridge et al. | 439/525 |
| 4,291,931 | 9/1981 | Stupay | 339/45 R |
| 4,349,238 | 9/1982 | Showman et al. | 339/75 M |
| 4,491,377 | 1/1985 | Pfaff | 339/74 R |
| 4,498,047 | 2/1985 | Hexamer et al. | 339/17 CF |
| 4,533,192 | 8/1985 | Kelley | 339/45 M |
| 4,618,199 | 10/1986 | Pfaff | 339/74 R |
| 4,623,208 | 11/1986 | Kerul et al. | 439/71 |
| 4,630,875 | 12/1986 | Korsunsky et al. | 439/73 |
| 4,675,599 | 6/1987 | Jensen et al. | 439/71 |
| 4,678,255 | 7/1987 | Carter | 439/71 |
| 4,691,975 | 9/1987 | Fukunaga et al. | 439/68 |

OTHER PUBLICATIONS

Enplas Socket Literature, 1987, 36 pages.
Textool "Chip Carrier Sockets", 6 pages.
Textool New Product Bulletin, 1 page (2 sheets).
Welcon Burn-In/Test Sockets, 33 pages.
Photograph, Yamaichi and Texas Instruments Sockets-Marketed Japan.

Primary Examiner—John McQuade

[57] ABSTRACT

A test socket for integrated circuit packages has a body member carrying a plurality of pairs of opposed contacts on either side of a circuit package receiving cavity which seats a depressible spring loaded platform. When a circuit package is inserted, the contacts make electrical contact with the circuit package terminals and are deflected outwardly as the package is pressed downwardly. The force exerted by the deflected contacts and the terminals is sufficient to provide good electrical contact and to overcome the biasing force on the platform to retain the circuit package in the socket. The circuit package is released by a tool which has a cavity to receive the body member and cam elements to deflect the contacts and permit the spring-loaded platform to move upwardly and release the circuit package.

16 Claims, 4 Drawing Sheets

ROTATE 90°

TEST SOCKET FOR AN INTEGRATED CIRCUIT PACKAGE

FIELD OF THE INVENTION

This invention relates to a test socket for testing and/or burning-in integrated circuit packages having generally rectangular peripheries with terminals positioned about their periphery.

BACKGROUND OF THE INVENTION

Integrated circuit packages are generally of a rectangular configuration with contacts or leads arranged along the edges of the package to provide connections to the interior circuitry.

It is necessary to test the circuitry in the integrated circuit packages before it is installed in a product to determine that the interior circuitry has been properly established and is suitable for its intended use, and also to test such packages for any subsequent failure after initial installation. In addition, it is frequently desirable to burn-in such packages as a technique for eliminating packages which would fail after a short period of time. In such burn-in testing, the package is stressed electrically, thermally and/or environmentally for a preselected period of time. Test sockets have been devised for these integrated circuit packages to test the circuit packages and to burn-in such circuit packages, as well as for experimental circuit applications.

As utilized herein, "test socket" includes sockets for testing, burning-in and experimental circuit applications.

Some test sockets currently sold by the Textool Division of Minnesota Mining and Manufacturing Company of St. Paul, Minn., have a body with a recess and contact elements thereabout to make electrical contact with terminals about the integrated circuit package. This socket has a cover hinged on the body to pivot downwardly thereagainst and then latch to the body. The cover has a pressure pad to force the terminals on the package against the contact elements.

A test socket sold by Plastronics Inc. of Irving, Tex. has a body with a top opening into which the package is inserted and contacts thereabout to make electrical connection to the terminals along the sides of the package. The package is released by inverting the socket and the printed circuit board to which the socket may be soldered, and pressing down on the board which depresses the socket to release and allow the package fall out. This construction is generally shown in Pfaff U.S. Pat. No. 4,491,377.

A socket presently made by the assignee of the present invention has a cavity into which the package is inserted and contacts thereabout to make electrical connection to terminals along the sides of the package. This test socket has a support and ejection mechanism including a spring-biased platform which may be pushed downwardly in the cavity past a cam lock. When the downward pressure is removed, the cam lock engages the platform to hold it in the depressed test position. Pressing on the package a second time disengages the cam lock and releases the platform which then moves upwardly carrying the package to the top of the socket. The structure is illustrated and described in Hexamer et al U.S. Pat. No. 4,498,047.

Kelley U.S. Pat. No. 4,533,192 illustrates a test socket which utilizes complex shaped contacts to mechanically lock an integrated circuit package therein under the contacts. It has a camming member and spring biased platform to flex the test socket contacts out of locking engagement with the circuit package terminals to permit removal of the circuit package.

Although these test sockets all perform the desired functions, there are often problems in case of package removal or proper electrical contact force, and/or access to and observation of the package during testing.

The present invention is directed to a new and improved test socket for integrated circuit packages which is of relatively simple construction and which permits easy top insertion and top removal of a circuit package.

Another object is to provide such a test socket which provides good electrical contact with the contacts of the circuit package and which permits observation of the package.

Still another object is to provide such a test socket which is adapted to use in automated installations.

A further object is to provide such a test socket with good wiping action on the contacts of the circuit package.

SUMMARY OF THE INVENTION

It has now been found that the foregoing and related objects may be readily attained in a test socket for integrated circuit packages of the type having a plurality of electrical terminals about the periphery thereof, which includes a body member having a cavity therein, and a platform in the cavity adapted to support the circuit package thereon and movable downwardly therein between an upper position and a lower position. Biasing means is provided on the body member to bias the platform to the upper position, and a multiplicity of resiliently deflectable electrical contacts are mounted on the body member and spaced about the cavity. The contacts have upper portions dimensioned and configured to bear against and make electrical contact with the terminals of the circuit package inserted into the socket, and the distance between opposed contact upper portions on opposite sides of the body member is less than the distance between terminals on opposite sides of the associated circuit package. Thus, when a circuit package is placed on the platform and the circuit package and the platform are depressed, there is wiping contact between the terminals and the contact portions and the contacts are deflected resiliently outwardly to receive the circuit package terminals therebetween and are biased thereagainst to make good electrical contact therewith. The contacts exert sufficient force on the terminals of the package to overcome the biasing force on the platform and to provide good electrical contact with the terminals of a circuit package inserted into the socket. To disengage the package, the socket includes a tool member having a cavity adapted to receive the upper portion of the body member therewithin and cam elements within the cavity aligned with the contacts which are adapted to be pressed against the upper portions of the contacts and thereby deflect them outwardly away from the terminals of the package. Thus, the platform may move upwardly to remove the circuit package from a position of retention by the contacts.

In accordance with the preferred embodiment, the upper portions of the contacts have inclined inner surfaces and the tool member cam elements have inclined surfaces configured to engage the inclined contact surfaces upon downward movement of the tool member to deflect the contacts.

Desirably, the upper portion of the contact provides a terminal contacting surface, and there is a support portion spaced downwardly from the upper portion and a resilient portion extending between the upper portion and the support portion.

The socket further includes a base member secured to the lower surface of the body member and cooperating with the body member to secure the contacts within the body portion. The body member has apertures extending therethrough which seat and position the contacts, and the contacts have leg portions extending downwardly from the support portions thereof and through the base member.

In a preferred embodiment, support arm portions extend generally horizontally from the resilient portion to seat snugly in the apertures. The upper ends of the upper portions of the contacts do not extend above the plane of the upper surface of the body member, and the body member has shoulders overlying the arms of the support portions and means limiting upward movement of the platform member to retain it in assembly therewith.

Most desirably, the contacts are formed of metal and are of rectangular cross section and the contacts are snugly received in apertures of rectangular cross-section extending between upper and lower surfaces of the body member.

Preferably, the arms of the support portion extend to opposite sides of the resilient portion and alternate contacts along a side of the cavity have leg portions depending from the support portions spaced to opposite sides of the resilient portions. The body member apertures are of rectangular cross section to seat the contacts snugly and to permit movement of the resilient portions of the contacts only toward and away from the circuit package receiving cavity.

DETAILED DESCRIPTION OF PREFERRED EMBODIMENT OF THE INVENTION

Figure 1:
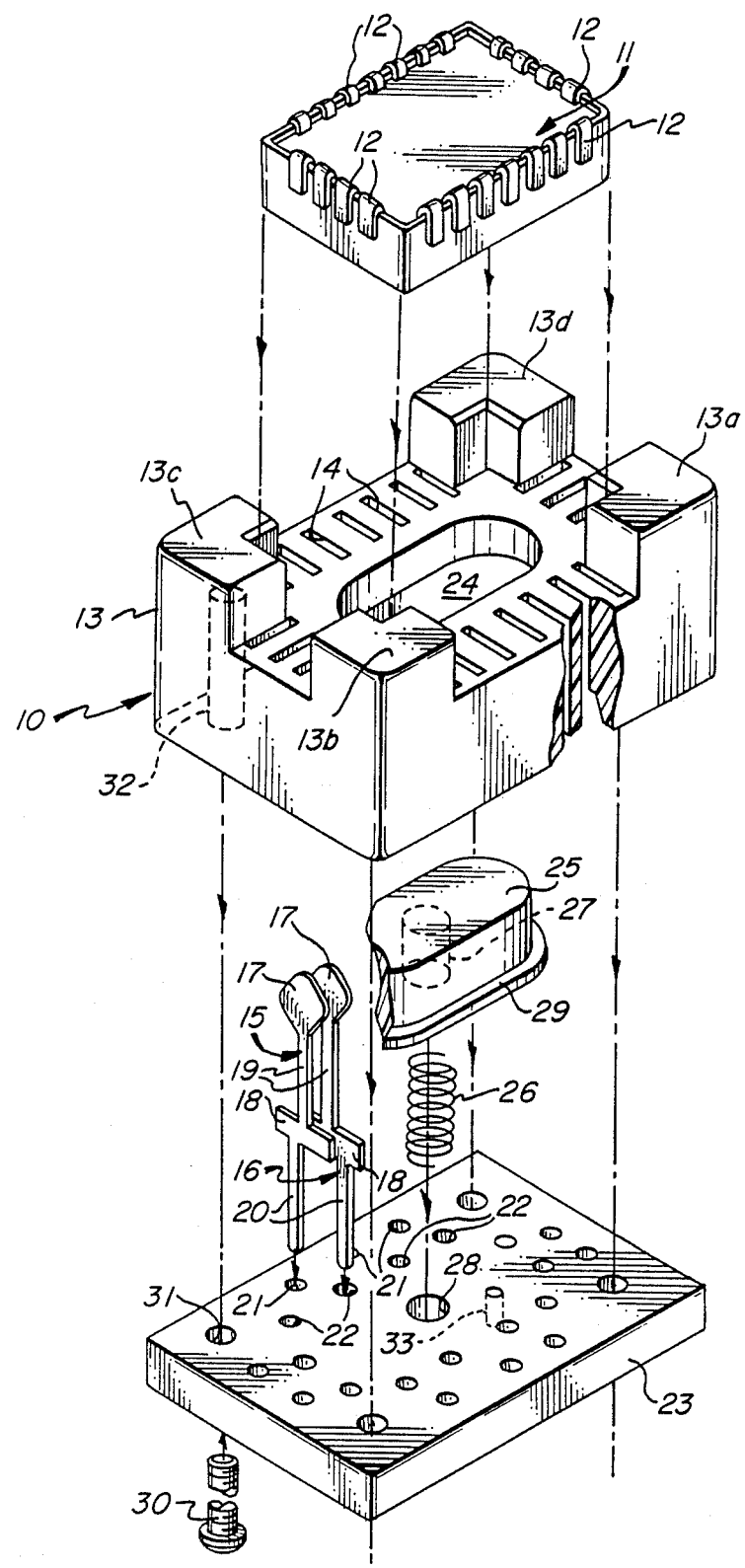
FIG. 1 is an exploded isometric view of a test socket embodying the invention.

FIG. 1 illustrates a test socket generally designated by the numeral 10 embodying the invention which is adapted to receive an integrated circuit package generally designated by the numeral 11 which has plurality of contact terminals 12 along the sides thereof. As illustrated, the circuit package 11 has seven terminals on two opposed sides, and four terminals on the other opposed sides.

The test socket 10 comprises a body member 13 which has a plurality of vertically extending, horizontally elongated apertures 14, of generally rectangular cross section adapted to alternately receive contacts generally designated by the numerals 15 and 16. The contacts 15 and 16 differ slightly in configuration for reasons hereinafter explained. Each of the contacts 15 and 16 has a circuit package terminal contact upper portion 17 and a horizontally extending support portion 18 which are connected by a resiliently deflectable portion 19. A leg portion 20 extends downwardly into apertures 21 or 22 in a base member 23. The contacts 15 and 16 are formed economically from sheet metal by stamping.

The lower end portions of the apertures 14 are elongated to provide recesses which seat snugly the support portions 18 to preclude lateral movement.

The apertures 14 are of generally rectangular cross section to receive the contacts 15 and 16 therein which are inserted through the bottom of body member 13 and locked therein by the base member 23. Apertures 21 and 22 in the base member 23 receive the leg portions 20 and are not in a single line but in two spaced rows to provide spacing of the leg portions 20 below the base member 23 and facilitate connections to a test circuit (not shown).

Figure 2:
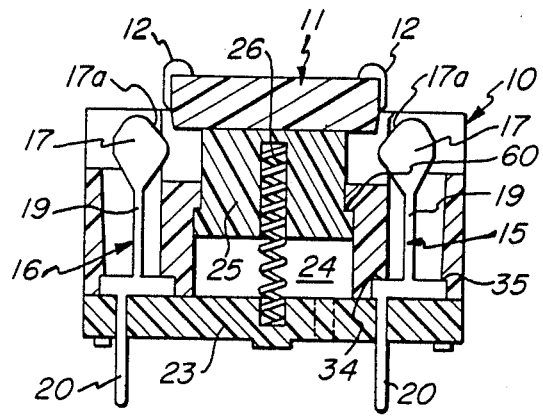
FIGS. 2, 3, and 4 are cross-sectional views of the assembled test socket of FIG. 1, showing an integrated circuit package being inserted thereinto in successive steps.

The body member 13 has four upstanding corner portions 13a, 13b, 13c and 13d of L-shaped cross section which define a rectangular cavity therebetween and also has an elongated aperture 24 below the cavity and generally centrally thereof. As seen in FIG. 2, a platform member 25 is received in the aperture 24 and is biased upwardly by a spring 26 which is received in the spring seat recess 27 in platform member 25 and the spring seat recess 28 in base member 23. The platform member 25 has a flange 29 about the lower periphery thereof which abuts a shoulder 60 adjacent the upper end of the aperture 24 to limit its upward movement therein.

The base member 23 is assembled to the body member 13 by fasteners 30 which extend through apertures 31 in the base member 23 and into receiving sockets 32 therefor in the body member 13. The cavity 24 is vented by a port 33 in base member 23.

Figure 3:
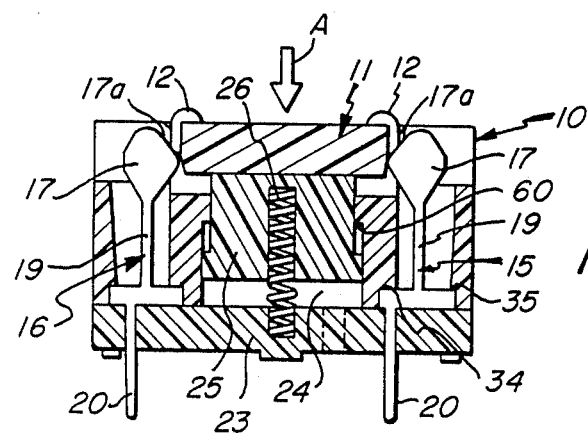
Figure 4:
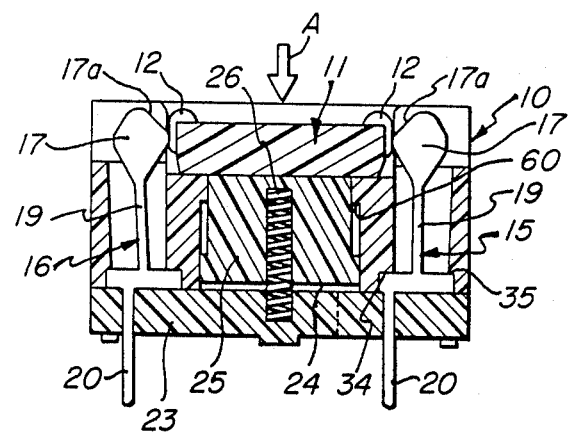

Reference is now made to FIGS. 2, 3, and 4, which are cross-sectional views of the assembled test socket of FIG. 1 as seen across a plane perpendicular to the major dimension thereof. It will be noted that the upper extremities of the contacts 15 and 16 lie below the plane of the upper surface of body member 13. The enlarged contact portions 17 lie partially within the rectangular apertures 14 to provide stability against sidewise movement of the contacts 15 and 16 and to act as a guide during the deflection of the contacts. In the relaxed state of the contacts 15, 16 shown in FIG. 2, the enlarged upper portions 17 extend over the body member 13 inwardly of the apertures 14 and are dimensioned to provide a spacing between opposed pairs thereof which is less than the dimension across the opposed terminals 12 of circuit package 11.

It will further be noted in FIG. 2 that the leg portions 20 of the contacts 15 and 16 are offset in different directions with respect to the support portions 18. This is to permit adjacent contacts 15 and 16 to have their connecting leg portions 20 offset as they extend through apertures 21, 22 in base member 23 to provide sufficient room between contacts for connection to test circuitry. For example, the legs 20 of contacts 15 are inserted in the apertures 21 and the legs of contacts 16 are inserted in apertures 22 of base member 23.

The enlarged lower portions of the apertures 14 in the body member 13 provide shoulders 34 and 35 which overlie and secure the contacts 15 and 16 in the body member 13 when base member 23 is joined thereto. This construction assures that the contacts 15 and 16 will be firmly locked in the assembled test socket.

An integrated circuit package 11 is inserted into the socket 10 as indicated by the arrow A in FIG. 3, at which time the terminals 12 on the circuit package abut inclined edges 17a of contact portions 17. The terminals 12 will ride down the inclined surfaces 17a and deflect outwardly the resilient portions 19 of the contacts. As shown in FIG. 4, at this time the spring 26 is compressed and exerts an upward bias on the platform member 25. The normal force of the contacts 15, 16 on the package 11 provides the desired degree of electrical contact force and the frictional engagement of the contact portions 17 of the contacts 15 and 16 exceeds the biasing pressure of spring 26 on platform member 25 which would otherwise tend to eject the circuit package 11.

Figure 5:
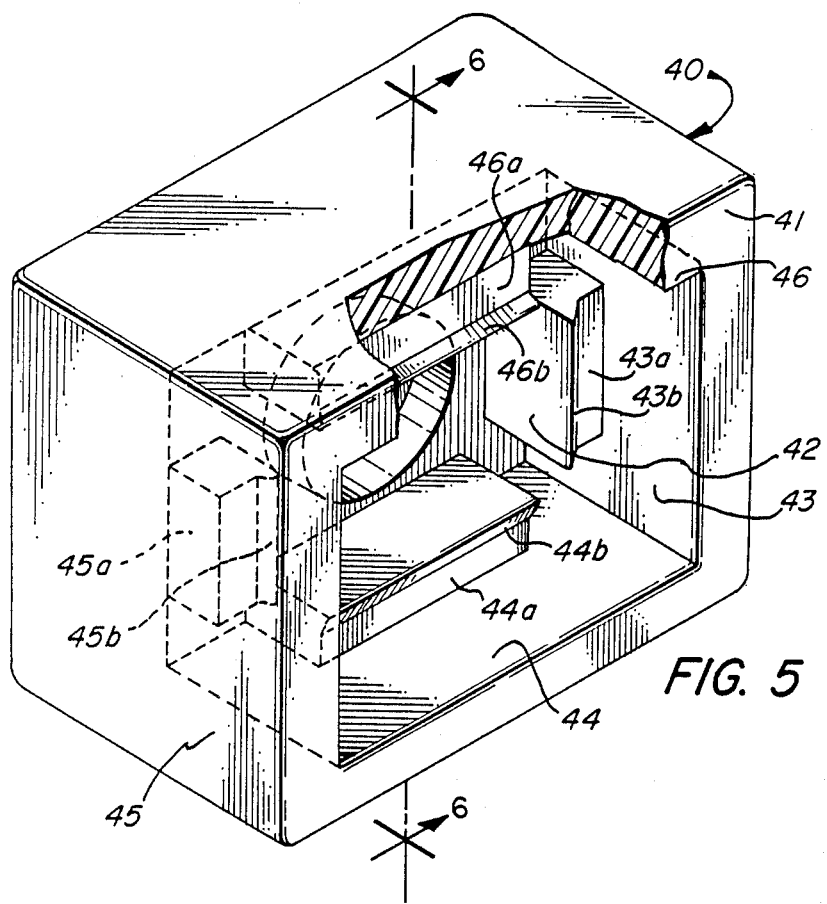
FIG. 5 is an isometric view of the removal tool of the test socket of FIG. 1.
Figure 6:
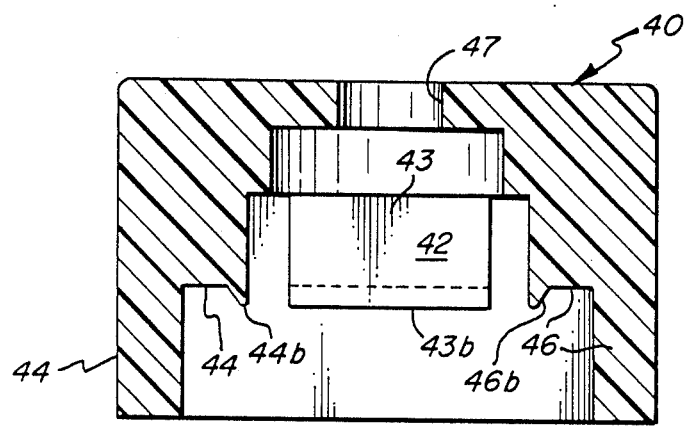
FIG. 6 is a cross sectional view seen in the plane of lines 6—6 of FIG. 5 and rotated 90°.

When the desired tests have been performed on the circuit package, the circuit package 11 must be removed from the test socket 10. As seen in FIGS. 5 and 6, the socket of the present invention includes a tool generally designated by the numeral 40 which permits removal of the integrated circuit package 11 from the test socket 10. This tool comprises a generally rectangular member 41 with a large cavity opening on its lower surface and defined by four sidewalls 43, 44, 45 and 46. Formed on the inside of each sidewall at the upper end of the cavity is a boss 43a, 44a, 45a, and 46a, respectively which define a smaller cav-ity or recess 42 dimensioned to receive the package 11. The bosses 43a, 44a, 45a and 46a have a depending projection 43b, 44b, 45b, and 46b, respectively, with inclined outer peripheral surfaces which are dimensioned and arranged to contact the inclined surfaces 17a of the contact portions 17 and deflect the opposed contacts outwardly. Tool 40 also has a central opening 47 which is adapted to receive a handle or other instrument for use in automated installations. The sidewalls of tool 40 are dimensioned to slide over and be guided by the sidewalls of the test socket 10. This tool is conveniently molded from synthetic resin for manual or low volume usage and machined from metal for automated, high volume installations.

Figure 7:
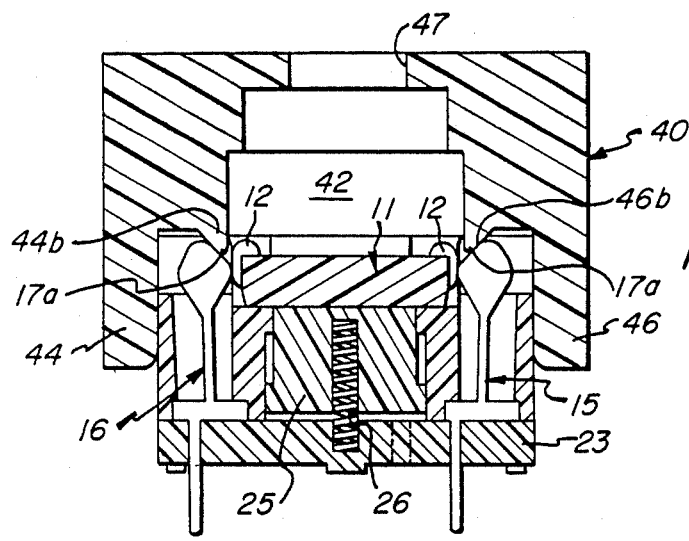
FIGS. 7, 8, and 9 are cross-sectional views of the assembled test socket of FIG. 1, together with the tool of FIGS. 5 and 6, illustrating in successive steps how an integrated circuit package is removed from the test socket.
Figure 8:
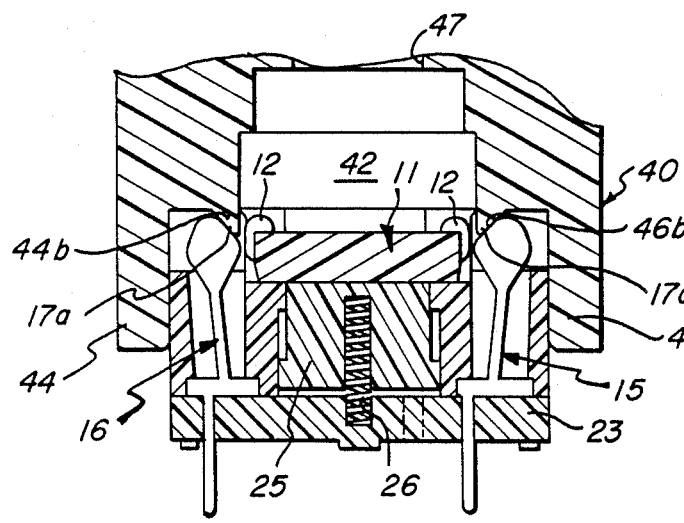
Figure 9:
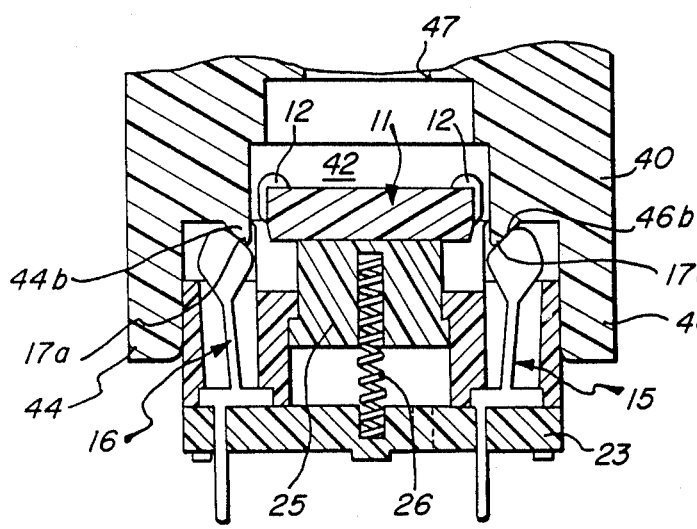

Reference is now made to FIGS. 7, 8 and 9 which exemplify the manner in which an integrated circuit package is removed from the test socket. The tool 40 is fitted over the body member 13 of the test socket 10 and is moved downwardly as it is guided by the sliding of its sidewalls on the sidewalls of the test socket. As the tool 40 is moved downwardly, the inclined edges of the projections 43b, 44b, 45b and 46b engage the inclined surfaces of the contact portion 17 of the contacts 15 and 16, as shown in FIG. 7. As the tool 40 is further depressed, the contacts 15 and 16 are deflected outwardly as shown in FIG. 8. When the engagement between the terminals 12 and the contacts 15 and 16 is terminated, the spring 26 urges platform member 25 upwardly and carries the integrated circuit package 11 upwardly into cavity 42 of the tool, as shown in FIG. 9. At this time, upward movement of platform member 25 is limited by the shoulder 60 and the circuit package is in the position shown in FIG. 2. Then the tool 40 is removed and the integrated circuit package may be removed by hand or by vacuum or by other mechanical means or by automated equipment.

Thus, it may be seen that the objects of the invention set forth, as well as those made apparent from the foregoing description, are efficiently attained. However, while a preferred embodiment of the invention has been set forth for purposes of disclosure, modifications to the disclosed embodiments of the invention, as well as other embodiments thereof, may occur to those skilled in the art. Accordingly, the appended claims are intended to cover all embodiments of the invention and mofifications to the disclosed embodiments which do not depart from the spirit and scope of the invention.

Having thus described the invention, what is claimed is:

1. A test socket for integrated circuit packages of the type having a plurality of electrical terminals about the periphery thereof, said socket comprising
    (a) a body member having a cavity therein;
    (b) a platform in said cavity adapted to support a circuit package thereon and movable downwardly therein between an upper position and a lower position;
    (c) biasing means on said body member biasing said platform to said upper position;
    (d) a multiplicity of resiliently deflectable electrical contacts mounted on said body member and spaced about said cavity, said contacts having upper portions dimensioned and configured to bear against and make electrical contact with the terminals of a circuit package inserted into said socket, the distance between opposed contact upper portions on opposite sides of said body member being less than the dimension between terminals on opposite sides of the associated circuit package so that, when a circuit package is placed on said platform and the circuit package and said platform are depressed, there is wiping contact between said terminals and said contact portions and said contacts are deflected resiliently outwardly to receive the circuit package terminals therebetween and are biased thereagainst to make good electrical contact therewith, said contacts exerting sufficient force on the terminals of the package to overcome the biasing force on said platform and to provide good electrical contact with the terminals of a circuit package inserted into said socket, and
    (e) a tool member having a cavity adapted to receive the upper portion of said body member therewithin and cam elements within said cavity aligned with said contacts adapted to be pressed against the upper portions of said contacts and deflect them outwardly away from the terminals of the package, whereby said platform may move upwardly to remove the circuit package from a position of retention by said contacts.

2. The socket of claim 1 wherein said upper portions of said contacts have inclined inner surfaces and said tool member cam elements have inclined surfaces configured to engage said contact surfaces upon downward movement of said tool member to deflect said contacts.

3. The socket of claim 1 wherein said upper portion of said contacts have a terminal contacting surface, a support portion spaced downwardly from said upper portion and a resilient portion extending between said upper portion and said support portion, and wherein said socket further includes a base member secured to the lower surface of said body member and cooperating with said body member to secure said contacts within said body portion.

4. The socket of claim 3 wherein said body member has apertures extending therethrough which seat and position said contacts.

5. The socket of claim 3 wherein said contacts have leg portions extending downwardly from said support portions thereof and through said base member.

6. The socket of claim 5 wherein said support portions comprise arms extending generally horizontally from said resilient portion to seat snugly in said apertures along opposite sides thereof.

7. The socket of claim 1 wherein the upper ends of said upper portions of said contacts do not extend above the plane of the upper surface of said body member.

8. The socket of claim 6 wherein said body member has shoulders overlying said arms of said support portions.

9. The socket of claim 1 wherein said body member has means limiting upward movement of said platform to retain it in assembly therewith.

10. The socket of claim 1 wherein said contacts are formed of metal and are of rectangular cross section, and wherein said contacts are snugly received in apertures of rectangular cross section extending between upper and lower surfaces of said body member.

11. The socket of claim 6 wherein alternate contacts along a side of said cavity have leg portions depending from said support portions spaced to opposite sides of said resilient portions.

12. The socket of claim 3 wherein said body member has a plurality of apertures of rectangular cross section seating said contacts and permitting movement of said resilient portions of said contacts only toward and away from said circuit package receiving recess.

13. A test socket for integrated circuit packages of the type having a plurality of electrical terminals around the periphery thereof, said socket comprising:
  (a) a body member having a cavity therein and a multiplicity of contact receiving apertures spaced about the sides of said cavity;
  (b) a plurality of contacts seated in said apertures, said contacts having a terminal contacting upper portion with outwardly inclined upper inner edge surfaces, a support portion spaced downwardly from said upper portion, a resiliently deflectable portion extending between said support portion and said upper portion, and a lower leg portion extending downwardly from said support portion,
  (c) a platform in said cavity adapted to support a circuit package and to be movable downwardly therein between an upper position and a lower position,
  (d) means biasing said platform to said upper position,
  (e) a base member having apertures therein receiving said leg portions of said contacts, said base member being secured to the lower surface of said body member and supporting said support portions of said contacts thereon, the spacing between opposed contact upper portions on opposite sides of said cavity being less than the dimension between terminals on opposite sides of the circuit package to be received therein so that, when a circuit package on said platform is moved downwardly, there is wiping contact between its terminals and said contact upper portions and said contacts resiliently deflect outwardly to receive the circuit package, said contact upper portions resiliently bearing upon terminals of the package to provide good elecrical contact and to overcome the biasing force on said platform, and
  (f) a tool member having a cavity adapted to receive the upper portion of the body member therein and cam elements within said cavity aligned with said inclined edges of said contact upper portions to deflect the contacts outwardly and away from the terminals of the package, whereby said platform may move upwardly to remove the circuit package from retention by said contact upper portions.

14. The socket of claim 13 wherein said contact leg portions extend downwardly from said support portions through said base member.

15. The socket of claim 13 wherein said support portions extend generally horizontally from said resilient portion to seat snugly in said apertures.

16. The socket of claim 13 wherein said body member has means limiting upward movement of said platform to retain it in assembly therewith.

* * * * *